United States Patent
Wu et al.

(10) Patent No.: US 9,917,007 B2
(45) Date of Patent: Mar. 13, 2018

(54) METHOD OF FORMING OPENING PATTERN

(71) Applicant: United Microelectronics Corp., Hsinchu (TW)

(72) Inventors: Yi-Yu Wu, Chiayi County (TW); Bin-Siang Tsai, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/188,621

(22) Filed: Jun. 21, 2016

(65) Prior Publication Data
US 2017/0365510 A1 Dec. 21, 2017

(51) Int. Cl.
*H01L 21/768* (2006.01)
*H01L 21/311* (2006.01)
*H01L 21/033* (2006.01)

(52) U.S. Cl.
CPC .... *H01L 21/76816* (2013.01); *H01L 21/0332* (2013.01); *H01L 21/31111* (2013.01); *H01L 21/31116* (2013.01); *H01L 21/31144* (2013.01)

(58) Field of Classification Search
CPC ......... H01L 21/31056; H01L 21/31053; H01L 21/31144
USPC ........................................................ 430/323
See application file for complete search history.

(56) References Cited

U.S. PATENT DOCUMENTS

| 7,858,532 B2 | 12/2010 | Lin | |
| 2001/0034106 A1* | 10/2001 | Moise | H01L 21/31122 438/396 |
| 2011/0212616 A1 | 9/2011 | Seidel et al. | |
| 2014/0030885 A1* | 1/2014 | Liu | H01L 21/76811 438/637 |

* cited by examiner

*Primary Examiner* — Daborah Chacko-Davis
(74) *Attorney, Agent, or Firm* — J.C. Patents

(57) ABSTRACT

A method of forming an opening pattern including the following steps is provided. An ultra low dielectric constant layer, a dielectric hard mask layer and a patterned metal hard mask layer are sequentially formed on a substrate. A portion of the dielectric hard mask layer is removed to form a patterned dielectric hard mask layer by using the patterned metal hard mask layer as a mask. The patterned metal hard mask layer is removed after forming the patterned dielectric hard mask layer. A portion of the ultra low dielectric constant layer is removed to form a first opening by using the patterned dielectric hard mask layer as a mask.

20 Claims, 2 Drawing Sheets

METHOD OF FORMING OPENING PATTERN

BACKGROUND OF THE INVENTION

Field of the Invention

The invention relates to a semiconductor process, and particularly relates to a method of forming an opening pattern.

Description of Related Art

The ultra low dielectric constant (ultra low-k, ULK) material is required to reduce the RC delay in the integrated circuits. With the minimization of the device, a patterned hard mask layer is foil led on the ultra low dielectric constant layer, and then the required opening pattern are precisely transferred to the ultra low dielectric constant layer by using the patterned layer as a mask.

SUMMARY OF THE INVENTION

The invention provides a method of forming an opening pattern which can avoid the distortion of the opening pattern.

The invention provides a method of forming an opening pattern including the following steps. An ultra low dielectric constant layer, a dielectric hard mask layer and a patterned metal hard mask layer are sequentially formed on a substrate. A portion of the dielectric hard mask layer is removed to form a patterned dielectric hard mask layer by using the patterned metal hard mask layer as a mask. The patterned metal hard mask layer is removed after forming the patterned dielectric hard mask layer. A portion of the ultra low dielectric constant layer is removed to form a first opening by using the patterned dielectric hard mask layer as a mask.

According to an embodiment of the invention, in the method of forming the opening pattern, a precursor of the ultra low dielectric constant layer includes diethoxymethylsilane (DEMS) and alpha-terpinene (ATRP).

According to an embodiment of the invention, in the method of forming the opening pattern, a method of forming the ultra low dielectric constant layer includes a chemical vapor deposition (CVD) method.

According to an embodiment of the invention, in the method of forming the opening pattern, a material of the dielectric hard mask layer includes aluminum nitride (AlN) or silicon oxynitride (SiON).

According to an embodiment of the invention, in the method of forming the opening pattern, a method of forming the dielectric hard mask layer includes a physical vapor deposition (PVD) method or a CVD method.

According to an embodiment of the invention, in the method of forming the opening pattern, a stress of the dielectric hard mask layer is −5000 Mpa to 2000 Mpa, for example.

According to an embodiment of the invention, in the method of forming the opening pattern, a material of the patterned metal hard mask layer includes titanium nitride (TiN).

According to an embodiment of the invention, in the method of forming the opening pattern, a method of forming the patterned metal hard mask layer includes a combination of a deposition process, a lithography process and an etching process.

According to an embodiment of the invention, in the method of forming the opening pattern, the deposition process includes a PVD method.

According to an embodiment of the invention, in the method of forming the opening pattern, a method of removing the portion of the dielectric hard mask layer includes a dry etching method.

According to an embodiment of the invention, in the method of forming the opening pattern, a method of removing the patterned metal hard mask layer includes a wet etching method.

According to an embodiment of the invention, in the method of forming the opening pattern, a method of removing the portion of the ultra low dielectric constant layer includes a dry etching method.

According to an embodiment of the invention, in the method of forming the opening pattern, an aspect ratio of the first opening is 5 to 10, for example.

According to an embodiment of the invention, in the method of forming the opening pattern, the first opening can be a trench or a via hole.

According to an embodiment of the invention, the method of forming the opening pattern further includes forming a cap layer on the substrate before forming the ultra low dielectric constant layer.

According to an embodiment of the invention, in the method of forming the opening pattern, a material of the cap layer includes SiC, SiCO or SiCN.

According to an embodiment of the invention, in the method of forming the opening pattern, a method of forming the cap layer includes a CVD method.

According to an embodiment of the invention, the method of forming the opening pattern further includes forming a second opening in the ultra low dielectric constant layer, wherein the second opening connects to a bottom of the first opening, and a width of the second opening is less than a width of the first opening.

According to an embodiment of the invention, in the method of forming the opening pattern, the second opening can be formed after or before forming the first opening.

According to an embodiment of the invention, in the method of forming the opening pattern, the second opening can be a via hole.

Based on the above description, in the method of forming the opening pattern, the patterned metal hard mask layer has been removed before forming the opening pattern. Therefore, the distortion of the opening pattern caused by the stress relaxation of the patterned metal hard mask layer can be avoided, and the opening pattern can have a better profile.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
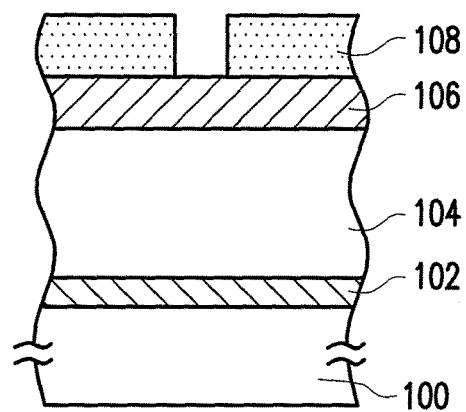
FIG. 1A to FIG. 1C are cross-sectional views illustrating a manufacturing process of an opening pattern according to an embodiment of the invention.
Figure 1B:
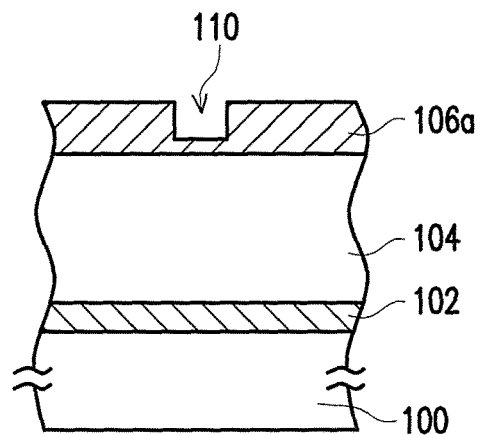
Figure 1C:
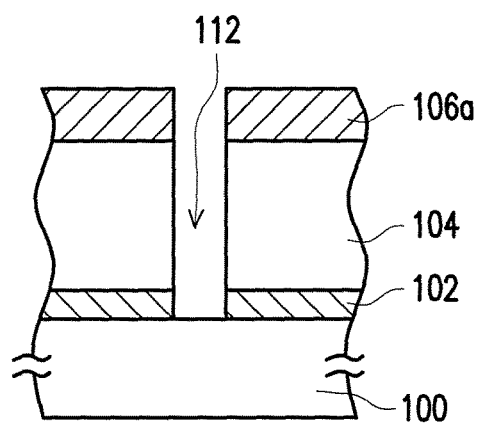

FIG. 1A to FIG. 1C are cross-sectional views illustrating a manufacturing process of an opening pattern according to an embodiment of the invention.

Referring to FIG. 1A, a cap layer 102 can be selectively formed on a substrate 100. The substrate 100 is a silicon substrate, for example. A person having ordinary skill in the art can form a conductive line or an electrode (not shown) in the substrate 100 according to the product design requirements. A material of the cap layer 102 includes SiC, SiCO or SiCN. A method of forming the cap layer 102 includes a CVD method.

An ultra low dielectric constant layer 104, a dielectric hard mask layer 106 and a patterned metal hard mask layer 108 are sequentially formed on the cap layer 102. A precursor of the ultra low dielectric constant layer 104 includes diethoxymethylsilane (DEMS) and alpha-terpinene (ATRP). A method of forming the ultra low dielectric constant layer 104 includes a CVD method. A material of the dielectric hard mask layer 106 includes aluminum nitride (AlN) or silicon oxynitride (SiON). A method of forming the dielectric hard mask layer 106 includes a PVD method or a CVD method. A stress of the dielectric hard mask layer 106 is −5000 Mpa to 2000 Mpa, for example. A material of the patterned metal hard mask layer 108 includes titanium nitride (TiN). A method of forming the patterned metal hard mask layer 108 includes a combination of a deposition process, a lithography process and an etching process, wherein the deposition process includes a PVD method.

Referring to FIG. 1B, a portion of the dielectric hard mask layer 106 is removed to form a patterned dielectric hard mask layer 106a by using the patterned metal hard mask layer 108 as a mask. A method of removing the portion of the dielectric hard mask layer 106 includes a dry etching method. The patterned dielectric hard mask layer 106a can have an opening 110. In the step of forming the patterned dielectric hard mask layer 106a, the ultra low dielectric constant layer 104 can be or not be exposed by the opening 110. In this embodiment, the ultra low dielectric constant layer 104 is not exposed by the opening 110 in the step of forming the patterned dielectric hard mask layer 106a, for example.

The patterned metal hard mask layer 108 is removed after forming the patterned dielectric hard mask layer 106a. Since the patterned metal hard mask layer 108 is removed before forming the opening pattern, the distortion of the opening pattern caused by the stress relaxation of the patterned metal hard mask layer 108 can be avoided. A method of removing the patterned metal hard mask layer 108 includes a wet etching method. The etchant of the wet etching method is EKC etchant, for example.

Referring to FIG. 1C, a portion of the ultra low dielectric constant layer 104 is removed to form an opening 112 by using the patterned dielectric hard mask layer 106a be a mask. In the step of forming the opening 112, a portion of the cap layer 102 can be removed, and the opening 112 can extend in the cap layer 102 to expose a portion of the substrate 100. A method of removing the portion of the ultra low dielectric constant layer 104 and the portion of the cap layer 102 includes a dry etching method. An aspect ratio of the opening 112 is 5 to 10, for example. The opening 112 can be a trench or a via hole.

Based on the aforementioned embodiments, the patterned metal hard mask layer 108 has been removed before forming the opening pattern (opening 112). Therefore, the distortion of the opening pattern caused by the stress relaxation of the patterned metal hard mask layer 108 can be avoided, and the opening pattern can have a better profile.

Figure 2A:
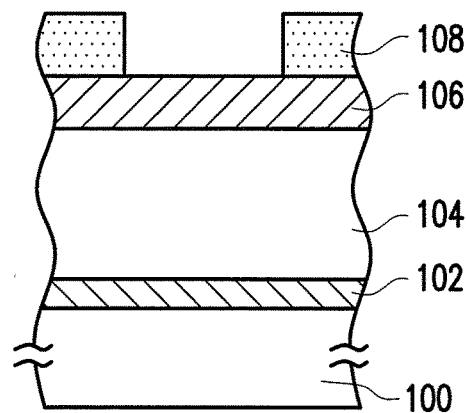
FIG. 2A to FIG. 2C are cross-sectional views illustrating a manufacturing process of an opening pattern according to another embodiment of the invention.
Figure 2B:
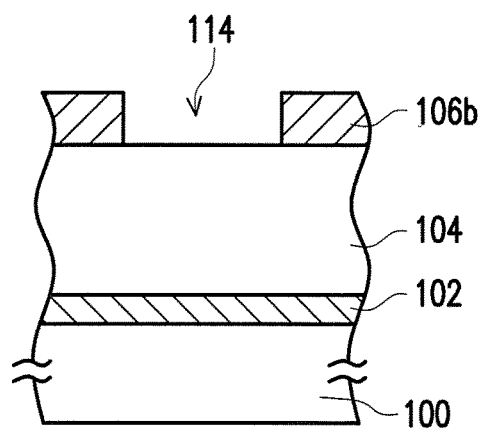
Figure 2C:
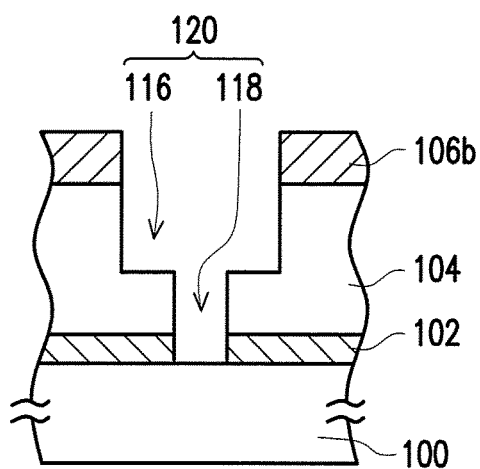

FIG. 2A to FIG. 2C are cross-sectional views illustrating a manufacturing process of an opening pattern according to another embodiment of the invention.

Referring to FIG. 2A, a cap layer 102 can be selectively formed on a substrate 100. An ultra low dielectric constant layer 104, a dielectric hard mask layer 106 and a patterned metal hard mask layer 108 are sequentially formed on the cap layer 102. The elements in FIG. 2A that are the same as the elements in FIG. 1A are represented by the same reference symbols, and the descriptions thereof are thus not repeated.

Referring to FIG. 2B, a portion of the dielectric hard mask layer 106 is removed to form a patterned dielectric hard mask layer 106b by using the patterned metal hard mask layer 108 as a mask. A method of removing the portion of the dielectric hard mask layer 106 includes a dry etching method. The patterned dielectric hard mask layer 1106b can have an opening 114. In the step of forming the patterned dielectric hard mask layer 1106b, the ultra low dielectric constant layer 104 can be or not be exposed by the opening 114. In this embodiment, the ultra low dielectric constant layer 104 is exposed by the opening 114 in the step of forming the patterned dielectric hard mask layer 1106b, for example.

The patterned metal hard mask layer 108 is removed after forming the patterned dielectric hard mask layer 1106b. Since the patterned metal hard mask layer 108 is removed before forming the opening pattern, the distortion of the opening pattern caused by the stress relaxation of the patterned metal hard mask layer 108 can be avoided. A method of removing the patterned metal hard mask layer 108 includes a wet etching method. The etchant of the wet etching method is EKC etchant, for example.

Referring to FIG. 2C, an opening 116 and an opening 118 are formed in the ultra low dielectric constant layer 104, wherein the opening 118 connects to a bottom of the opening 116 to form an opening 120, and a width of the opening 118 is less than a width of the opening 116. In this embodiment, the opening 120 is exemplified as a dual damascene opening, wherein the opening 116 can be a trench, and the opening 118 can be a via. The opening 120 can be formed by a method of forming an opening of a dual damascene process. For example, a portion of the ultra low dielectric constant layer 104 is removed to form the opening 116 and the opening 118 by using the patterned dielectric hard mask layer 1106b and a patterned photoresist layer (not shown) as a mask. The opening 118 can be formed after or before forming the opening 116.

In the step of forming the opening 120, a portion of the cap layer 102 can be removed, and the opening 120 can extend in the cap layer 102 to expose a portion of the substrate 100. A method of removing the portion of the ultra low dielectric constant layer 104 and the portion of the cap layer 102 includes a dry etching method. An aspect ratio of the opening 120 is 5 to 10, for example.

Based on the aforementioned embodiments, the patterned metal hard mask layer 108 has been removed before forming the opening pattern (opening 120). Therefore, the distortion of the opening pattern caused by the stress relaxation of the patterned metal hard mask layer 108 can be avoided, and the opening pattern can have a better profile.

In summary, in the aforementioned embodiments, the patterned metal hard mask layer has been removed before forming the opening pattern, such that the distortion of the opening pattern can be avoided, and the opening pattern can have a better profile.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of forming an opening pattern, comprising:
    sequentially forming an ultra low dielectric constant layer, a dielectric hard mask layer and a patterned metal hard mask layer on a substrate, wherein a method of forming the patterned metal hard mask comprises forming a metal hard mask layer on the substrate and removing a portion of the metal hard mask layer to form the patterned metal hard mask layer, the dielectric hard mask layer is disposed directly on the ultra low dielectric constant layer, and a material of the dielectric hard mask layer comprises aluminum nitride or silicon oxynitride;
    removing a portion of the dielectric hard mask layer to form a patterned dielectric hard mask layer by using the patterned metal hard mask layer as a mask;
    removing the patterned metal hard mask layer after forming the patterned dielectric hard mask layer; and
    removing a portion of the ultra low dielectric constant layer to form a first opening by using the patterned dielectric hard mask layer as a mask, wherein the patterned dielectric hard mask layer remains on the ultra low dielectric constant layer after removing the portion of the ultra low dielectric constant layer to form the first opening, wherein the opening pattern has the first opening.

2. The method of forming the opening pattern of claim 1, wherein a precursor of the ultra low dielectric constant layer comprises diethoxymethylsilane and alpha-terpinene.

3. The method of forming the opening pattern of claim 1, wherein a method of forming the ultra low dielectric constant layer comprises a chemical vapor deposition method.

4. The method of forming the opening pattern of claim 1, wherein a material of the dielectric hard mask layer comprises aluminium nitride or silicon oxynitride.

5. The method of forming the opening pattern of claim 1, wherein a method of forming the dielectric hard mask layer comprises a physical vapor deposition method or a chemical vapor deposition method.

6. The method of forming the opening pattern of claim 1, wherein a stress of the dielectric hard mask layer is −5000 Mpa to 2000 Mpa.

7. The method of forming the opening pattern of claim 1, wherein a material of the patterned metal hard mask layer comprises titanium nitride.

8. The method of forming the opening pattern of claim 1, wherein a method of forming the metal hard mask layer comprises a deposition process, and a method of removing the portion of the metal hard mask layer comprises a lithography process and an etching process.

9. The method of forming the opening pattern of claim 1, wherein a method of removing the portion of the dielectric hard mask layer comprises a dry etching method.

10. The method of forming the opening pattern of claim 1, wherein a method of removing the patterned metal hard mask layer comprises a wet etching method.

11. The method of forming the opening pattern of claim 1, wherein a method of removing the portion of the ultra low dielectric constant layer comprises a dry etching method.

12. The method of forming the opening pattern of claim 1, wherein an aspect ratio of the first opening is 5 to 10, and wherein the aspect ratio of the first opening is a ratio of a depth of the first opening to a width of the first opening.

13. The method of forming the opening pattern of claim 1, wherein the first opening comprises a trench or a via hole.

14. The method of forming the opening pattern of claim 1, further comprising forming a cap layer on the substrate before forming the ultra low dielectric constant layer.

15. The method of forming the opening pattern of claim 14, wherein a material of the cap layer comprises SiC, SiCO or SiCN.

16. The method of forming the opening pattern of claim 14, wherein a method of forming the cap layer comprises a chemical vapor deposition method.

17. The method of forming the opening pattern of claim 1, further comprising forming a second opening in the ultra low dielectric constant layer, wherein the second opening connects to a bottom of the first opening, and a width of the second opening is less than a width of the first opening, and the opening pattern has the first opening and the second opening.

18. The method of forming the opening pattern of claim 17, wherein the second opening is formed after or before forming the first opening.

19. The method of forming the opening pattern of claim 17, wherein the second opening comprises a via hole.

20. A method of forming an opening pattern, comprising:
    sequentially forming an ultra low dielectric constant layer, a dielectric hard mask layer and a patterned metal hard mask layer on a substrate, wherein a method of forming the patterned metal hard mask comprises forming a metal hard mask layer on the substrate and removing a portion of the metal hard mask layer to form the patterned metal hard mask layer;
    removing a portion of the dielectric hard mask layer to form a patterned dielectric hard mask layer by using the patterned metal hard mask layer as a mask, wherein a remainder portion of the dielectric hard mask layer below a removed portion of the dielectric hard mask layer is retained on the ultra low dielectric constant layer after the patterned dielectric hard mask layer has been formed;
    removing the patterned metal hard mask layer after forming the patterned dielectric hard mask layer; and
    removing a portion of the ultra low dielectric constant layer to form a first opening by using the patterned dielectric hard mask layer as a mask, wherein the patterned dielectric hard mask layer remains on the ultra low dielectric constant layer after removing the portion of the ultra low dielectric constant layer to form the first opening, wherein the opening pattern has the first opening.

* * * * *